United States Patent
Pilo et al.

(10) Patent No.: US 9,613,700 B1
(45) Date of Patent: Apr. 4, 2017

(54) TCAM FIELD ENABLE LOGIC

(71) Applicant: Invecas, Inc., Santa Clara, CA (US)

(72) Inventors: Harold Pilo, Underhill, VT (US); Gerald P. Pomichter, Fairfax, VT (US); Michael Lee, Bronxville, NY (US); John Edward Barth, Jr., Williston, VT (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/183,591

(22) Filed: Jun. 15, 2016

(51) Int. Cl.
*G11C 15/00* (2006.01)
*G11C 15/04* (2006.01)
*H03K 19/177* (2006.01)
*H03K 19/00* (2006.01)

(52) U.S. Cl.
CPC ......... *G11C 15/04* (2013.01); *H03K 19/0013* (2013.01); *H03K 19/1776* (2013.01)

(58) Field of Classification Search
CPC .................................... G11C 15/04
USPC ........... 365/49.1, 49.11, 49.12, 49.13, 49.15, 365/49.16, 49.17, 49.18, 50; 711/108
See application file for complete search history.

(56) References Cited

U.S. PATENT DOCUMENTS

| | | | | |
|---|---|---|---|---|
| 3,389,377 | A * | 6/1968 | Cole | G11C 15/04 365/49.17 |
| 7,035,968 | B1 * | 4/2006 | Pereira | G11C 15/00 707/999.006 |
| 8,098,532 | B2 * | 1/2012 | Komine | G11C 11/5628 365/185.03 |

* cited by examiner

*Primary Examiner* — Jason M Crawford
(74) *Attorney, Agent, or Firm* — Venture Pacific Law, PC (57) ABSTRACT

A content addressable memory ("CAM") field enabling logic comprises fields and field enable logics. The fields each have local match lines and a corresponding field enable control for enabling the respective field. The field enable logics are serially connected. Each of the fields is coupled to a corresponding one of the field enable logics via the respective local match lines. The corresponding field enable control for each of the fields is coupled to the corresponding one of the field enable logic and to any ones of the field enable logics that come after the corresponding one of the field enable logic along the serially-connected field enable logics.

20 Claims, 7 Drawing Sheets

TCAM FIELD ENABLE LOGIC

FIELD OF INVENTION

The disclosure relates to a content addressable memory ("CAM") having selectable fields, and, more particularly, to a CAM having field enable logic.

BACKGROUND

A content addressable memory ("CAM") is commonly used in cache and other address translation systems for high speed computing. A ternary content addressable memory ("TCAM") is a ternary state CAM, commonly used for parallel searches in high performance computing systems. The unit of data stored in a TCAM bitcell is ternary, i.e., having three possible states: logic one, logic zero, and don't care state (referred to as an "X" state). To store these three states, TCAM bitcells include a pair of memory elements.

A TCAM can be referenced by its contents, which has found use in lookup table implementations such as cache memory subsystems. TCAM cells are now rapidly finding use in networking applications such as network address translation and other applications such as pattern recognition and data compression. A valuable feature of the TCAM is its ability to perform a fast search operation in which search data is compared with stored data. Typically, a searched data word is loaded onto search lines and compared with stored data words in the TCAM. The stored data words are compared bit-by-bit with the searched data word. During a search-and-compare operation, the TCAM performs a parallel search and generates match or mismatch signal associated with each stored data word, indicating whether the search word matches any of the stored data words.

Generally, an indication of a match or mismatch can be indicated on a match line. Compare circuits of TCAM cells for a stored data word can have their respective outputs logically dotted together in a dot-XOR structure via the match line. If any of the compare circuits are on (i.e., driving the match line to a low state to indicate a mismatch), a mismatch can be identified for that respective stored data word. If the match line goes to a high state, then the stored data word can be identified as a match and the location of that data entry is outputted. Due to a charging requirement for operation, the match line can consume large amounts of power, especially when there can be thousands of data word entries and match lines for each entry. For this reason, the TCAM consumes relatively high power and generates large current pulses to operate compare circuits, match lines, and match line sense amplifiers of the TCAM.

TCAM match lines typically can be separated into independent, selectable fields (e.g., fields 0 through 7, referenced as FE[0:7]) to form large data search words (e.g., 640 bits). Separation of a large data search word may be required for a few reasons: independent control of each field can allow for power savings since only selected fields may dissipate power; logical blocking of sections of the search word may be required for partial internet protocol ("IP") address look-ups (or for other schemes that allow for partial data searches); and segmentation of match lines for improved performance.

Figure 1:
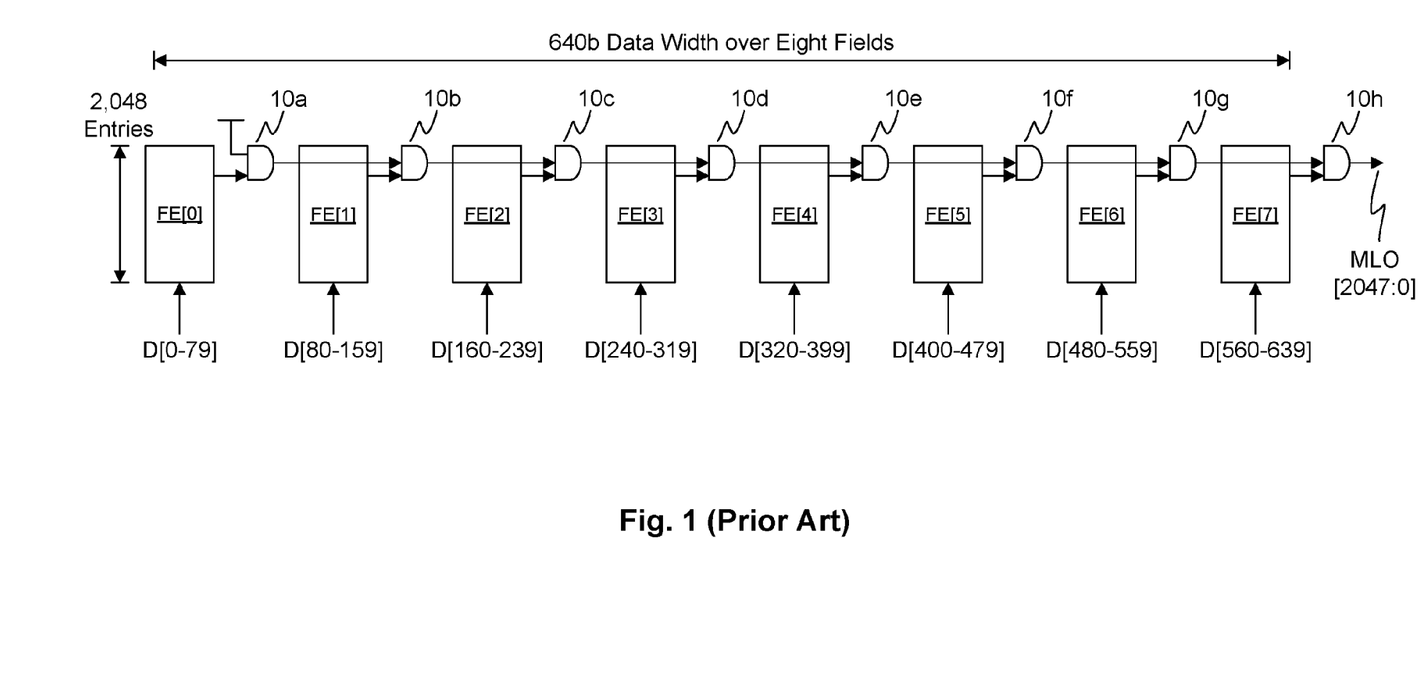
FIG. 1 illustrates a prior art block diagram for ternary content addressable memory ("TCAM") field enable logic having AND gates for providing selectable fields.

FIG. 1 illustrates a prior art block diagram for ternary content addressable memory field enable logic having AND gates for providing selectable fields. A TCAM field enable logic comprises fields FE[0]-FE[7] and AND gates 10a-10h. The fields FE[0]-FE[7] each store 80-bit segments (i.e., D[0-79], D[80-159], D[160-239], D[240-319], D[320-399], D[400-479], D[480-559], and D[560-639] of a 640-bit data width word and have 2048 entries. The fields FE[0]-FE[7] can output local match lines for searching the 80-bit entries within each of the fields. The AND gates 10a-10h are serially connected, where each of the serial connections of the AND gates 10a-10h serve as global match lines. The global MLs are forwarded from one AND gate to another AND gate, eventually being outputted as a global match line out ("MLO") for each entry.

The fields FE[0]-FE[7] are coupled to a corresponding one of the AND gates 10a-10h. The local MLs of FE[0] are coupled to inputs of the AND gate 10a; the local MLs of FE[1] are coupled to inputs of the AND gate 10b; the local MLs of FE[2] are coupled to inputs of the AND gate 10c; the local MLs of FE[3] are coupled to inputs of the AND gate 10d; the local MLs of FE[4] are coupled to inputs of the AND gate 10e; the local MLs of FE[5] are coupled to inputs of the AND gate 10f; the local MLs of FE[6] are coupled to inputs of the AND gate 10g; and the local MLs of FE[7] are coupled to inputs of the AND gate 10h.

Another input of the AND gate 10a is coupled to a high logic value (e.g., Vdd). The AND gates 10b-10g output to an input of a next AND gate to form the serial connection. In particular, the AND gate 10a outputs to an input of the AND gate 10b; the AND gate 10b outputs to an input of the AND gate 10c; the AND gate 10c outputs to an input of the AND gate 10d; the AND gate 10d outputs to an input of the AND gate 10e; and so on and so forth. Thereby, the fields can forward local match lines down the serial connection of AND gates for further evaluation. The last AND gate 10h generates a composite global match line MLO for each of the data entries 0-2047.

To support independent field control, each unselected field must force its global MLs to Vdd so that the remaining fields in the search word can continue to evaluate. For instance, assuming fields driven by FE[0], FE[1], FE[2], FE[5], and FE[6] are unselected and fields drive by FE[3], FE[4], and FE[7] are selected, then the selected fields need to be evaluated independent of the unselected fields. Each unselected field must drive its local MLs' output active (e.g., 2K MLs for a 2K-entry TCAM) so that selected fields may continue the search operation on the logically common, but physically separated, global MLs. Thus, the unselected fields that must force their global match line's outputs active even though they are not selected to allow the search on down-stream fields to continue, which undesirably consumes power.

Figure 2:
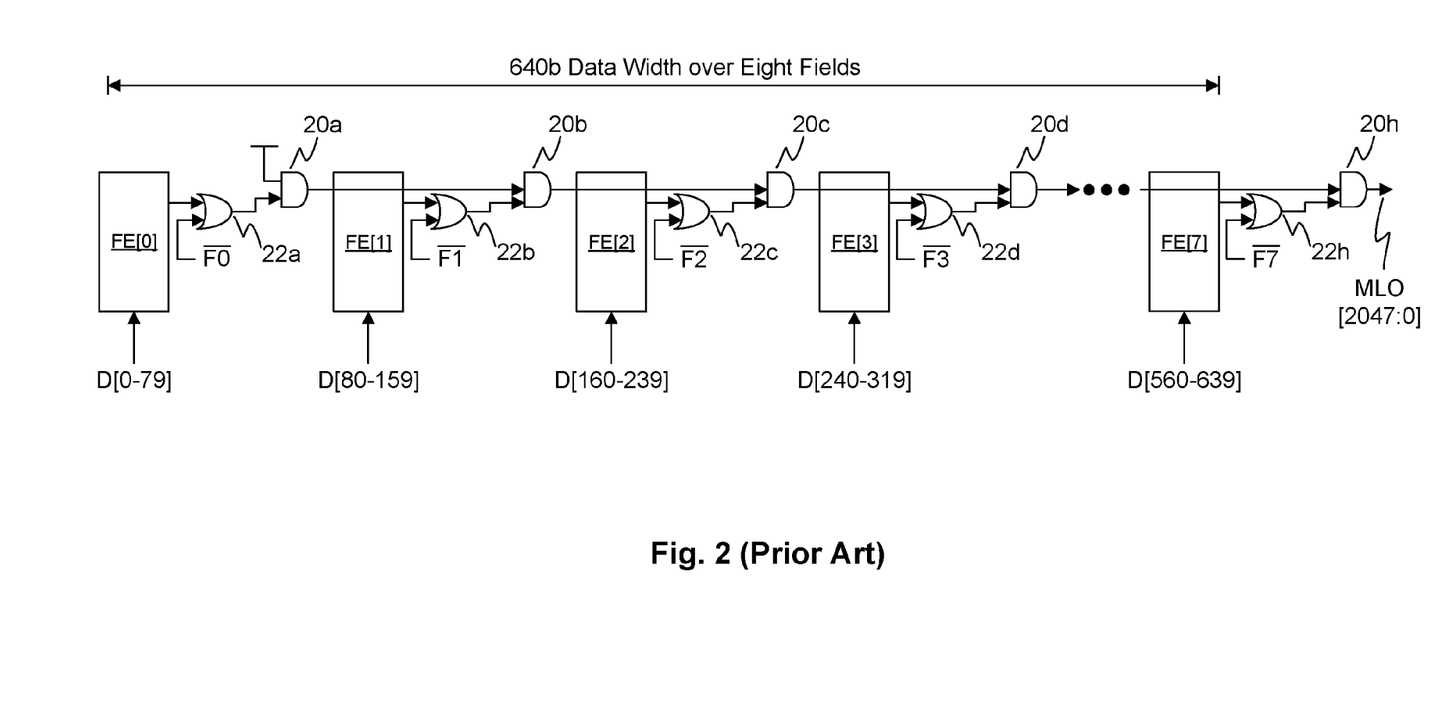
FIG. 2 illustrates a prior art block diagram for TCAM field enable logic having AND-OR structures for forwarding global match lines from one field to a next field.

FIG. 2 illustrates another prior art block diagram for TCAM field enable logic having logic gates for forwarding a global match line for each entry from one field to a next field. In an effort to avoid having to activate local MLs, additional logic is added to provide for masking the local MLs of the unselected fields. In this manner, global MLs are forced active whenever a respective field is not in use rather than forcing the local match lines high.

Referring to FIG. 2, a TCAM field enable logic comprises fields FE[0]-FE[7], OR gates 22a-22h, and AND gates 20a-20h. Similarly to the previous prior art, the fields FE[0]-FE[7] each store 80-bit segments (i.e., D[0-79], D[80-159], D[160-239], D[240-319], D[320-399], D[400-479], D[480-559], and D[560-639] of a 640-bit data width and have local MLs for searching the 80-bit entries within the fields. The AND gates 10a-10h are serially connected, where each of the AND gates' 10a-10h serial connections provide for the global MLs.

Each of the fields FE[0]-FE[7] has a corresponding field enable control signal F0-F7, which are used to activate (also referred to as enable and/or select) a respective field or deactivate (also referred to as disable and/or unselect) a respective field. The inverse of these signals, $\overline{F0}$-$\overline{F7}$, are coupled to inputs of the OR gates 22a-22h for masking any inactive local MLs. When a field is selected, the corresponding control signal F will be a high logic value, e.g., "1", to indicate that the field is selected. The inverse of the control signal, i.e., $\overline{F}$, is at a low logic value, e.g., "0". Conversely, when the field is unselected, the corresponding control signal F will be a low logic value, e.g., "0", to indicate that the field is unselected. The inverse of the control signal, i.e., $\overline{F}$, is at a high logic value, e.g., "1". Thereby, the corresponding OR gate will output a high logic value to mask any inactive local match lines of the unselected field.

In particular, the local MLs for each of the fields FE[0]-FE[7] are coupled to inputs of a corresponding one of the OR gates 22a-22h. The local MLs of the field FE[0] and the inverse signal $\overline{F0}$ are inputted to the OR gate 22a. The OR gate 22a applies an OR logic operation to the inputs, and then outputs the result to an input of the AND gate 20b. The other input of the AND gate 20a is coupled to a high voltage value, Vdd. The output of the AND gate 20a provides the input for the next AND gate 20b. Thus, when the field FE[0] is unselected, then the inverse signal $\overline{F0}$ will be set to a high logic value so that the AND gate 20a receives high logic values for its input to forward the global match line to a next AND-OR structure.

The local MLs for the field FE[1] and the inverse of the control signal for the field FE[1] are inputted to the OR gate 22b. The output of the OR gate 22b is inputted to the AND gate 20b. The output of the AND gate 20b serves as a global match line for each entry, which is inputted to a next AND gate along the serially connected AND gates 20a-20h. This can continue until all of the local MLs of the remaining fields and the respective inverse signals are coupled to a respective one of the OR gates.

In an example, fields FE[0]-FE[2] are unselected. The AND-OR structure forces their global MLs active so that field FE[3] and any other active fields thereon can continue with a search operation. Subsequently, 2K global MLs and associated driver logic need to be activated across a large portion of the entire data width, wasting unnecessary power.

For the foregoing reasons, there is a need for methods, apparatuses, and systems for enabling fields of a CAM with improved power savings.

SUMMARY OF INVENTION

Briefly, the disclosure relates to a content addressable memory ("CAM") field enabling logic, comprising: fields, wherein the fields each have local MLs and wherein the fields each have a corresponding field enable control for enabling the respective field; and field enable logics for generating a next global match line, wherein the field enable logics are serially connected, wherein each of the fields is coupled to a corresponding one of the field enable logics via the respective local MLs, and wherein the corresponding field enable control for each of the fields is coupled to the corresponding one of the field enable logic and to any ones of the field enable logics that come after the corresponding one of the field enable logic along the serially-connected field enable logics.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The following content addressable memory ("CAM") examples are meant to aid in the understanding of the present disclosure, and are not meant to limit the present disclosure. It is understood that a person having ordinary skill in the art can use the present disclosure for a variety of memory systems and for other semiconductor devices and systems that have searchable memory and fields. Furthermore, it is appreciated that a CAM may have additional implementation details not outlined but known to a person having ordinary skill in the art. It is understood that those other components can be used in conjunction with the present disclosure.

Figure 3A:
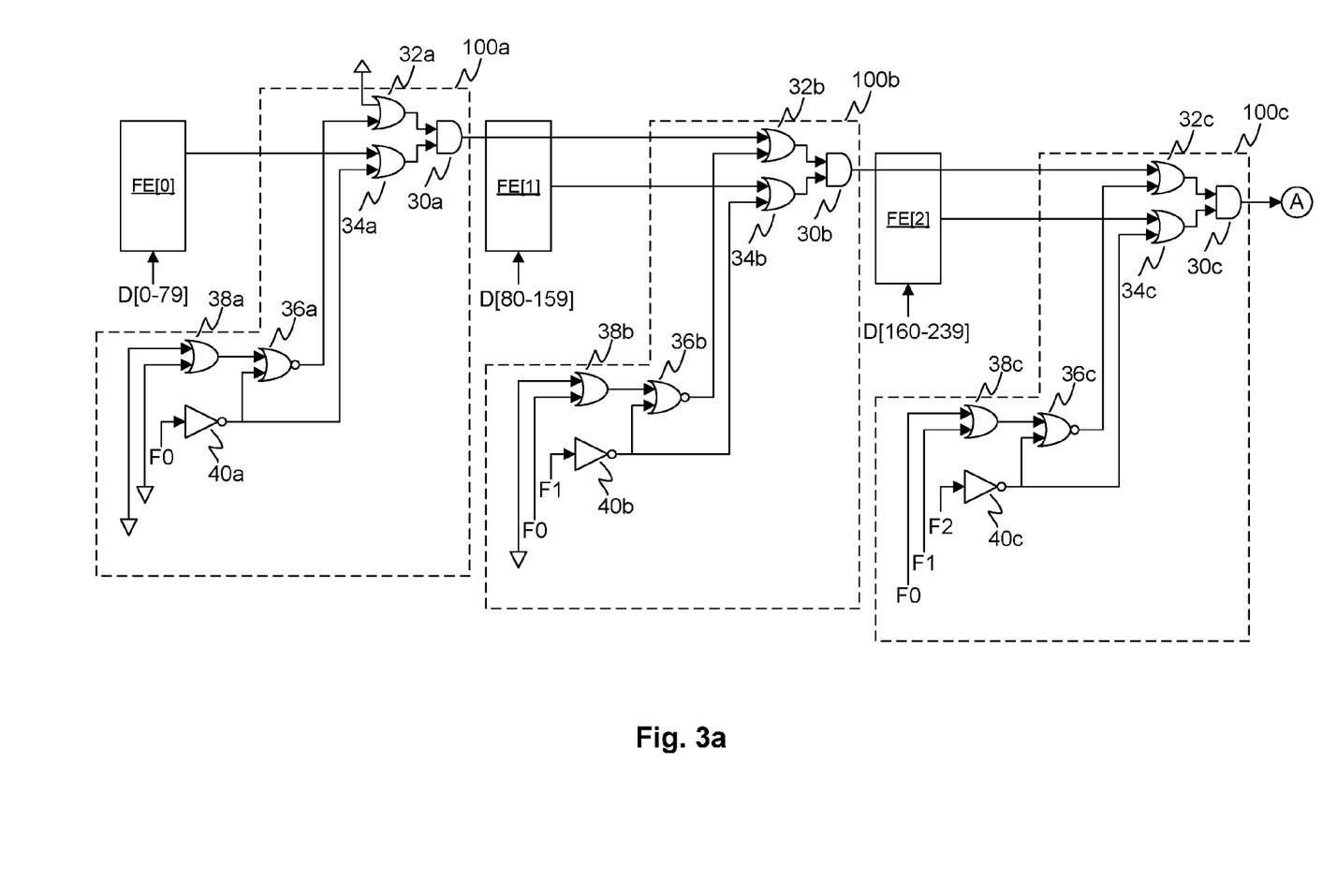
FIGS. 3a-3c illustrate a CAM field logic of the present disclosure.
Figure 3B:
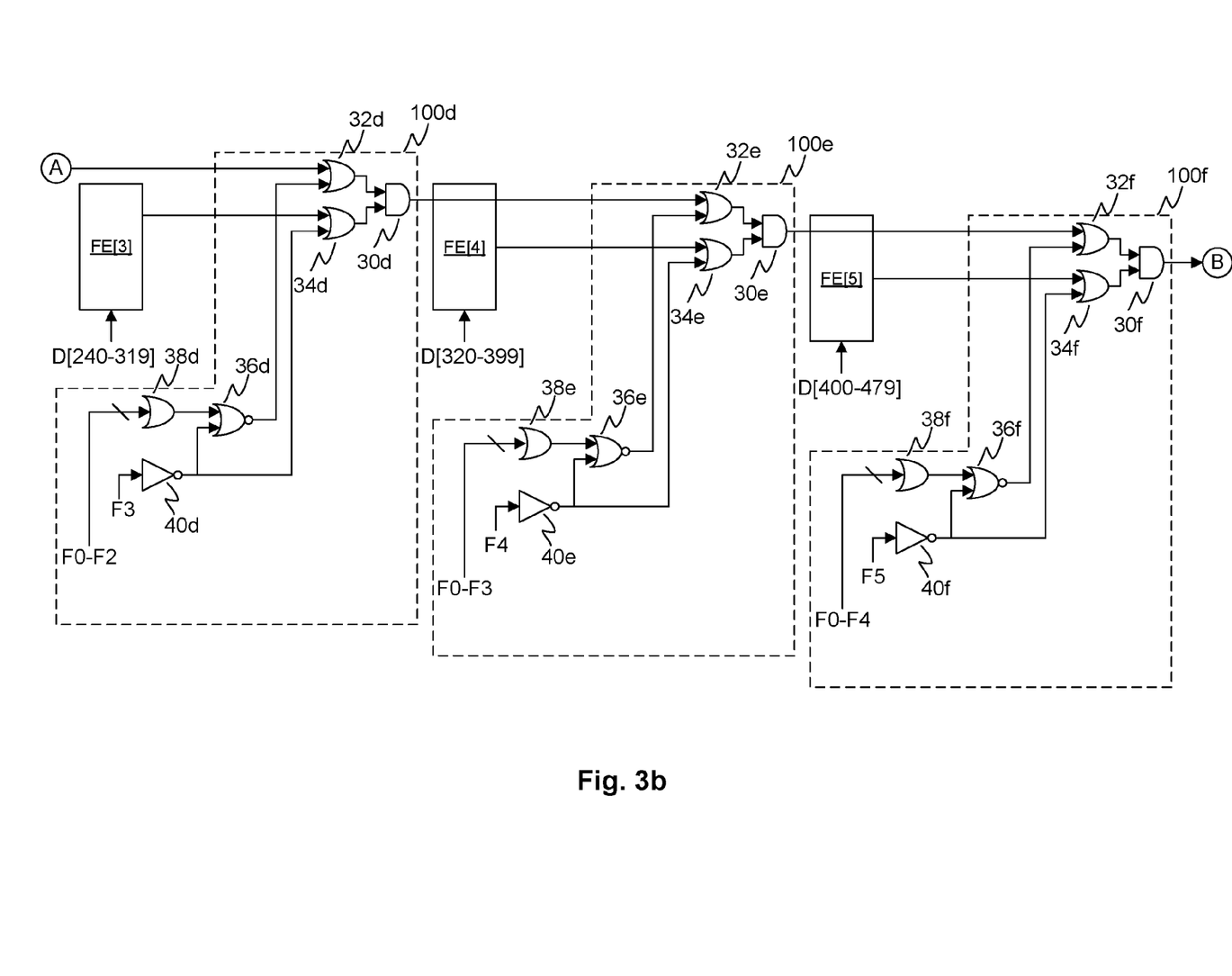
Figure 3C:
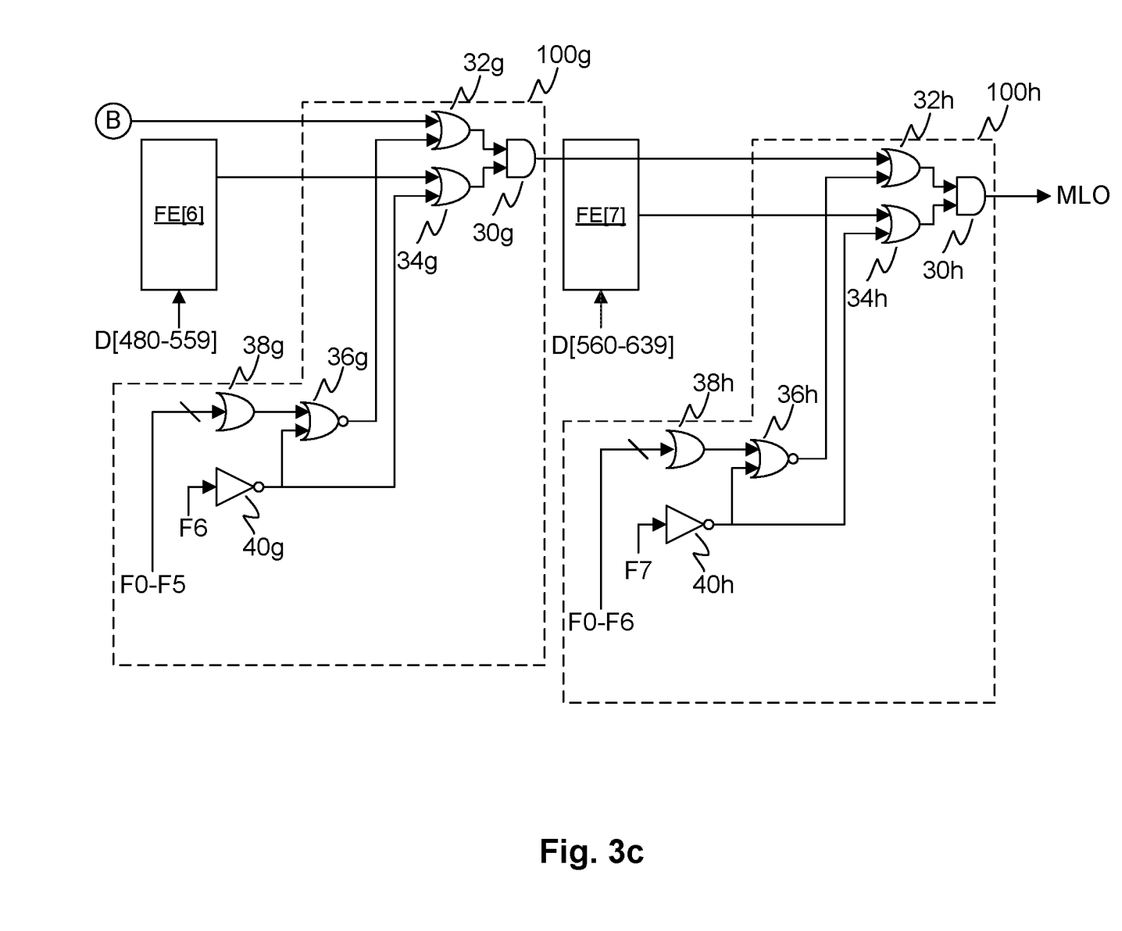

FIGS. 3a-3c illustrate a CAM field logic of the present disclosure. A carry-look-ahead-field-enable ("CLAFE") system, simply referred to as a CAM field logic, is used to prevent unselected fields that precede selected fields from activating its corresponding global MLs. Field enable controls can be forwarded to the next fields and accumulated across subsequent fields to evaluate global MLs on the fields that follow the first selected field. Any fields preceded by unselected fields ignore incoming global MLs. The unselected fields evaluate incoming global MLs only if one or more of the preceding fields are active. Local ML outputs are ignored when a field is unselected and any of the preceding fields are active. Thus, global MLs corresponding to unselected fields are not forced active; thereby providing power savings. The unselected fields can be referred to as disabled.

Referring to FIGS. 3a-3c, assuming there are eight fields FE[0]-FE[7] for a 640-bit data width, the CAM field logic comprises the fields FE[0]-FE[7] and field enable logics 100a-100h, where the field enable logics 100a-100h are serially connected for generating global MLs. The fields FE[0]-FE[7] each correspond with one of the field enable logics 100a-100h. Furthermore, the fields FE[0]-FE[7] each have outputs of local MLs that are coupled to inputs of the corresponding field enable logics 100a-100h. The present example uses eight fields for a data width of 640 bits. However, it is appreciated by a person having ordinary skill in the art that the present disclosure can be used in conjunction with a varying number of fields and data widths.

Field enable controls F0-F7 indicate which of the fields are selected or unselected. The field enable controls F0-F7 are coupled to inputs of the field enable logics 100a-100h in a cascading manner. For instance, the field enable control F0 indicates whether the field FE[0] is selected or unselected. The field enable control F0 is coupled to inputs for the corresponding field enable logic 100a and to the field enable logics 100b-100h that serially follow after field enable logic 100a.

The field enable control F1 indicates whether the field FE[1] is selected or unselected. The field enable control F1 is coupled to inputs for the corresponding field enable logic 100b and to the field enable logics 100c-100h that serially follow after the field enable logic 100b.

The field enable control F2 indicates whether the field FE[2] is selected or unselected. The field enable control F2 is coupled to inputs for the corresponding field enable logic 100c and to the field enable logics 100d-100h that follow after field enable logic 100c. This cascading pattern can continue in such manner for the other field enable controls F3-F6.

The last field enable control F7 indicates whether the field FE[7] is selected or unselected. The field enable control F7 is only coupled to an input of the corresponding field enable logic 100h since there are no following field enable logics in this example. Furthermore, since the field enable logic 100h is the last field enable logic along the serially-connected field enable logics 100a-100h, the field enable logic 100h also receives the previous field enable controls F0-F6.

Each of the field enable logics 100a-100h comprises a mask generation block for generating a global mask and a local mask and a global match line generation block. In an example of the field enable logics, each of the field enable logics 100a-100h comprise three OR gates, a NOR gate, an inverter, and an AND gate. However, it is appreciated by a person having ordinary skill in the art that the implementation of the field enable logics can vary or be otherwise logically equivalent using other implementations in conjunction with the present disclosure. The following example is only one instance of those various implementations to aid in the understanding of the present disclosure.

The field enable logic 100a comprises OR gates 32a, 34a, 38a, a NOR gate 36a, an inverter 40a, and an AND gate 30a. The OR gate 38a, the inverter 40a, and the NOR gate 36a can be collectively referred to as a mask generation block. The OR gates 32a and 34a and the AND gate 30a can be collectively referred to as a global match line generation block. Since the field enable logic 100a is the first logic of the serially-connected field enable logics 100a-100h, the inputs of the OR gate 38a are coupled to ground. Furthermore, the OR gate 38a is an optional element for the first field enable logic. Typically, a similarly disposed OR gate in the other field enable logics along the serially-connected field enable logics will have one or more previous field enable controls coupled to the inputs of the OR gate.

The field enable control F0 is coupled to the input of the inverter 40a. The inputs of the OR gate 38a are coupled to ground. The outputs of the OR gate 38a and of the inverter 40a are coupled to the inputs of the NOR gate 36a. An input for the OR gate 32a is coupled to ground, and another input for the OR gate 32a is coupled to the output of the NOR gate 36a. The outputs of the OR gate 32a and of the OR gate 34a are coupled to the input of the AND gate 30a. The local MLs from the field FE[0] are coupled to an input of the OR gate 34a. Another input of the OR gate 34a is coupled to the output of the inverter 40a. The output of the AND gate 30a provides global MLs to a next field enable logic, i.e., to an input of an OR gate 32b of the next field enable logic 100b.

The field enable logic 100b comprises OR gates 32b, 34b, and 38b, a NOR gate 36b, an inverter 40b, and an AND gate 30b. The internal connections for the field enable logic 100b are structurally similar to the field enable logic 100a. However, the inputs for the field enable logic 100b can vary in part to its location along the serially connected field enable logics 100a-100h. For instance, the field enable controls F0 and F1, the local MLs of field FE[1], and global MLs from the previous field enable logic 100a are inputted to the field enable logic 100b. In particular, the field enable control F0 is coupled to an input of the OR gate 38b. The corresponding field enable control F1 is coupled to an input of the inverter 40b. The local MLs of the field FE[1] are coupled to the inputs of the OR gate 34b. The global MLs from the previous field enable logic 100a are coupled to the input of the OR gate 32b. The AND gate 30b generates global MLs to be outputted to an OR gate 32c of the next one of the field enable logics along the serial connections, i.e., field enable logic 100c.

Likewise, the field enable logics 100c-100h each comprise similar elements and internal connections as field enable logic 100a. For instance, the field enable logic 100c comprises OR gates 32c, 34c, and 38c, a NOR gate 36c, an inverter 40c, and an AND gate 30c; the field enable logic 100d comprises OR gates 32d, 34d, and 38d, a NOR gate 36d, an inverter 40d, and an AND gate 30d; the field enable logic 100e comprises OR gates 32e, 34e, and 38e, a NOR gate 36e, an inverter 40e, and an AND gate 30e; the field enable logic 100f comprises OR gates 32f, 34f, and 38f, a NOR gate 36f, an inverter 40f, and an AND gate 30f; the field enable logic 100g comprises OR gates 32g, 34g, and 38g, a NOR gate 36g, an inverter 40g, and an AND gate 30g; and the field enable logic 100h comprises OR gates 32h, 34h, and 38h, a NOR gate 36h, an inverter 40h, and an AND gate 30h.

However, the field enable logic 100c has inputs coupled to the field enable controls F0-F2, the local MLs from field FE[2], and the global MLs from the previous field enable logic 100b. The field enable logic 100c generates and outputs global MLs to the following enable logic 100d. The field enable logic 100d has inputs coupled to the field enable controls F0-F3, the local MLs from field FE[3], and the global MLs from the previous field enable logic 100c. The field enable logic 100d generates and outputs global MLs to a following enable logic 100e. The field enable logic 100e has inputs coupled to the field enable controls F0-F4, the local MLs from field FE[4], and the global MLs from the previous field enable logic 100d. The field enable logic 100e generates and outputs global MLs to a following enable logic 100f. The field enable logic 100f has inputs coupled to the field enable controls F0-F5, the local MLs from field FE[5], and the global MLs from the previous field enable logic 100e. The field enable logic 100f generates and outputs global MLs to a following enable logic 100g. The field enable logic 100g has inputs coupled to the field enable controls F0-F6, the local MLs from field FE[6], and the global MLs from the previous field enable logic 100f. The field enable logic 100g generates and outputs global MLs to a following enable logic 100h.

The field enable logic 100h has inputs coupled to the field enable controls F0-F7, the local MLs from field FE[7], and the global MLs from the previous field enable logic 100g. The field enable logic 100h generates and outputs match line outputs MLOs for the entries stored in the fields.

Figure 4:
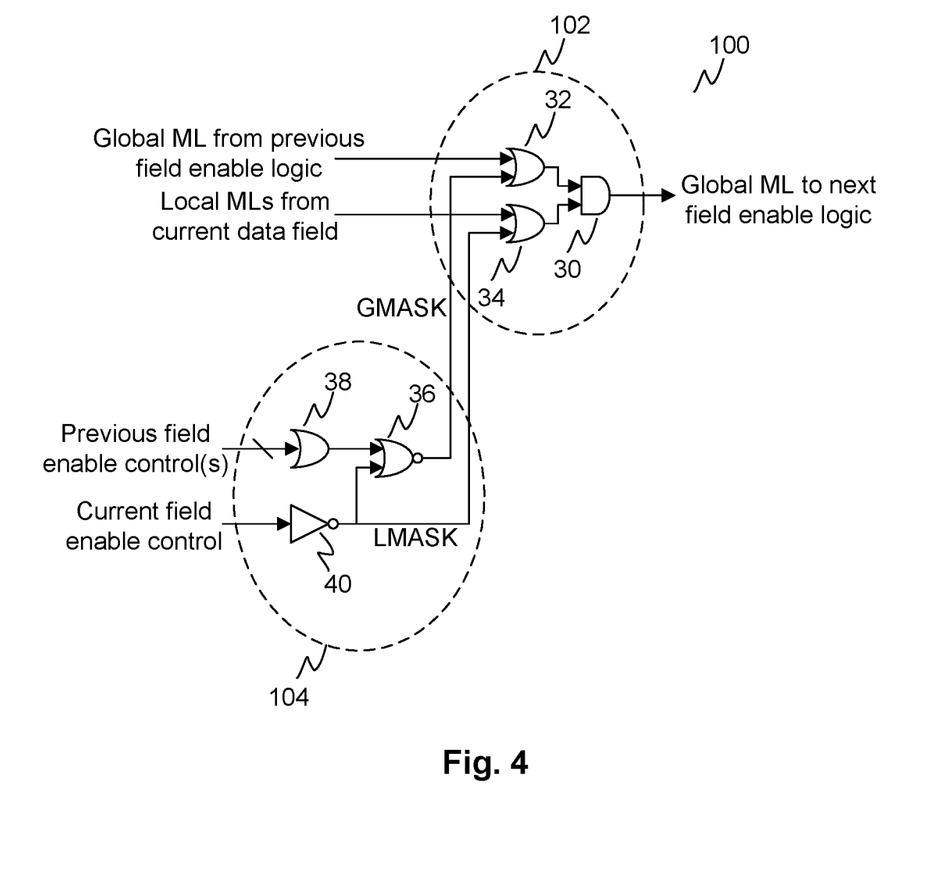
FIG. 4 illustrates a field enable logic of the present disclosure.

FIG. 4 illustrates a field enable logic of the present disclosure. A field enable logic 100 comprises a mask generation block 104 for generating a global mask and a local mask and a global match line generation block 102. The mask generation block 104 can comprise OR gate 38, NOR gate 36, and an inverter 40. Previous field enable control(s) (if any) are coupled to inputs of the OR gate 38 and the current field select is coupled to the input of the inverter 40. The previous field enable control(s) and the current field enable control are relative terms depending on where the respective field enable logic is located along a group of serially-connected field enable logics and which field is directly coupled to the respective field enable logic. The corresponding field enable control for that coupled field is referred to as the current field enable control. Any other field enable controls used for other previous field enable logics along the serially-connected field enable logics are referred to as the previous field enable controls.

The global match line generator block 102 comprises OR gate 32 and 34 and an AND gate 30. The AND gate 30 generates and outputs global MLs to the next field enable logic along the serial connection. The LMASK and GMASK allow for generating global MLs from the AND gate 30 without having to forward previous global match lines from previous field enable logics that are not selected. For instance, the inverter 40 generates the LMASK signal, which is a high logic value when the current field is not selected and a low logic value when the current field is selected. When the current field is not selected, then the local MLs do not need to be activated. However, to allow for forwarding of the global match line (if needed), the OR gate 34 provides a high logic value to the AND gate 30.

Also, the output of the NOR Gate 36 is coupled to the input of the OR gate 32. If the current field enable control is selected (i.e., at a high logic value) and the previous field enable control(s) are all unselected (i.e., at a high logic value), then the previous global MLs can be disregarded and the GMASK signal is a high logic value for generating a next global match line while activating the local MLs. In other words, the current field enable logic is the first logic to be selected.

If the current field enable control is unselected (i.e., at a low logic value) and at least one of the previous field enable control(s) was selected (i.e., at a high logic value), then the previous global MLs is forwarded with the GMASK signal at a low logic value. The local MLs are not activated since the current field enable control is unselected. However, since at least one of the previous fields was selected, the global match line generation block 102 forwards the previous global match lines to the next field enable logic for searching or as the MLOs if the current field enable logic is the last one.

If the current field enable control is selected (i.e., at a high logic value) and at least one of the previous field enable control(s) was selected (i.e., at a high logic value), then the previous global MLs are forwarded with the GMASK signal at a low logic value. The local MLs are also activated since the current field enable control is selected. The global match line generation block 102 ANDS the logical inputs from the previous global match lines with the local match lines and outputs its global match lines to the next field enable logic or as the MLOs if the current field enable logic is the last one.

To summarize, the global mask signal (GMASK) is active only on the first selected field. The local mask signal (LMASK) is active for each unselected field. For selected fields near least-significant-bit sections of the word, only the selected MLs fire and carry on to the global MLs. Furthermore, only activated global MLs carry matches from local MLs of selected fields are activated.

Figure 5:
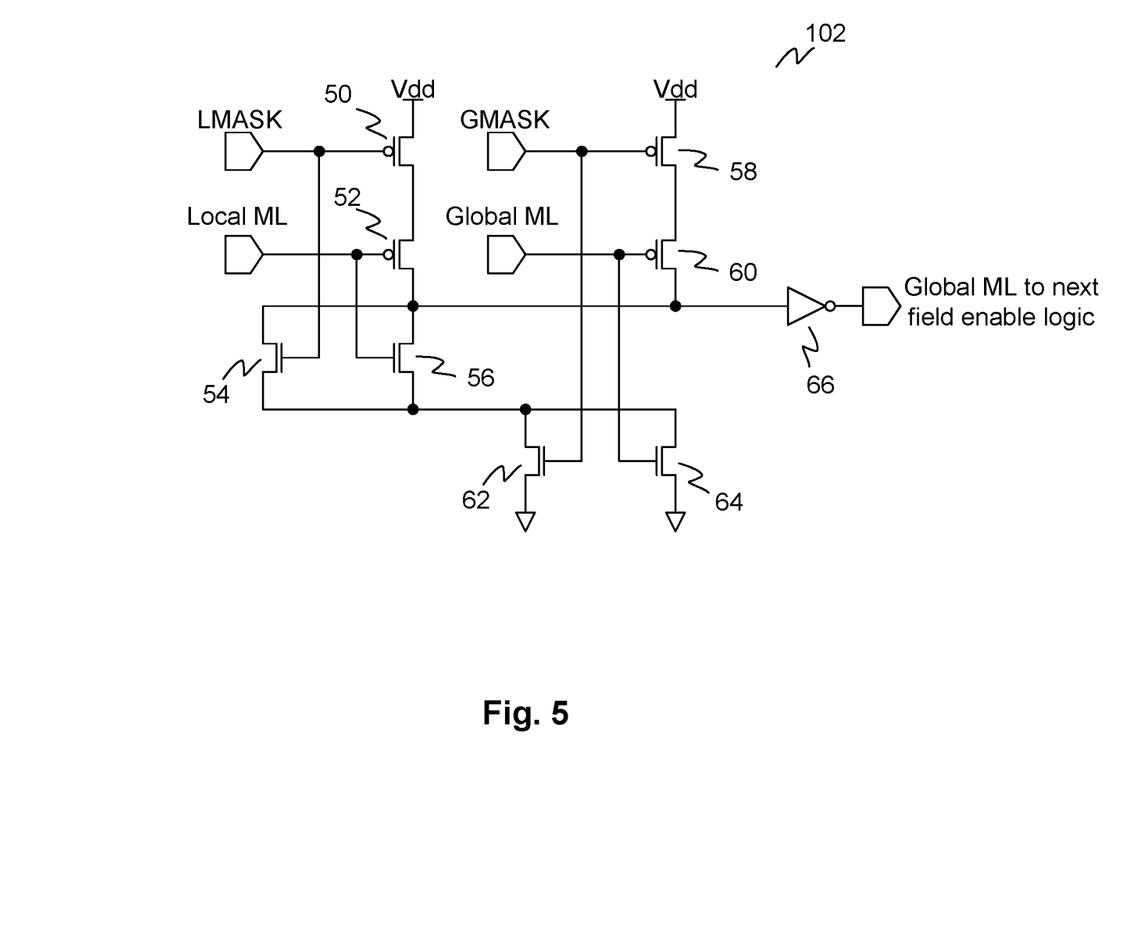
FIG. 5 illustrates a circuit implementation of a field enable logic of the present disclosure.

FIG. 5 illustrates a circuit implementation of a field enable logic of the present disclosure. The global match line generation block 102 can be implemented in a number of logically equivalent implementations. In particular, the global match line generation block 102 can comprise PMOS transistors 50, 52, 58 and 60, NMOS transistors 54, 56, 62, and 64, and an inverter 66. The PMOS transistors 50 and 52 are serially connected across a high voltage Vdd and an input of the inverter 66. The PMOS transistors 58 and 60 are also serially connected across the high voltage Vdd and the input of the inverter 66.

The NMOS transistors 54 and 56 are connected in parallel across the input of the inverter 66 and a common node of the NMOS transistor 62 and 64. The gate of NMOS 54 is coupled to the gate of the PMOS transistor 50 and the LMASK signal. The gate of NMOS 56 is coupled to the gate of the PMOS transistor 52 and the local ML signal.

The NMOS transistors 62 and 64 are connected in parallel across ground and the common node with the NMOS transistors 54 and 56. The gate of the NMOS transistor 62 is coupled to the gate of the PMOS transistor 58 and the GMASK signal. The gate of the NMOS transistor 64 is coupled to the gate of the PMOS transistor 60 and the global ML signal. The global ML signal is from a previous field enable logic or tied to ground if the current field enable logic is the first one in the series of field enable logics. The inverter 66 generates and outputs global match lines to the next field enable logic or as the MLO.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A content addressable memory ("CAM") field logic, comprising:
   fields, wherein the fields each have local match lines and wherein the fields each have a corresponding field enable control for enabling the respective field; and
   field enable logics for generating next global match lines, wherein the field enable logics are serially connected, wherein each of the fields is coupled to a corresponding one of the field enable logics via the respective local match lines, and
   wherein the corresponding field enable control for each of the fields is coupled to the corresponding one of the field enable logic and to any ones of the field enable logics that come after the corresponding one of the field enable logic along the serially-connected field enable logics.

2. The CAM field enabling logic of claim 1 wherein the field enable logics each comprise a mask generation block for generating a global mask and a local mask and a next global match line generation block for generating the next global match lines.

3. The CAM field enabling logic of claim 2 wherein the next global match line generation block comprises a first OR gate, a second OR gate, and an AND gate, wherein the global mask and previous global match lines are coupled to inputs of the first OR gate, wherein the local match lines and the local mask are coupled to the inputs of the second OR gate, and wherein outputs of the first OR gate and the second OR gate are coupled to the inputs of the AND gate for generating the next global match lines.

4. The CAM field enabling logic of claim 3 wherein the previous global match lines are provided by a previous one of the field enable logics that is directly before the corresponding one of the field enable logic along the serially-connected field enable logics.

5. The CAM field enabling logic of claim 3 wherein the previous global match lines for a first one of the serially-connected field enable logics are coupled to a low logic value.

6. The CAM field enabling logic of claim 2 wherein the mask generation block comprises a first OR gate, a first NOR gate, and an inverter, wherein previous field enable controls are coupled to inputs of the first OR gate, wherein the local mask is generated by the output of the inverter, wherein the corresponding field enable control is coupled to an input of the inverter, and wherein the outputs of the first OR gate and the inverter are coupled to the inputs of the NOR gate to generate the global mask.

7. The CAM field enabling logic of claim 6 wherein the previous field enable controls for a first one of the serially-connected field enable logics is coupled to ground.

8. A method for content addressable memory ("CAM") field enabling for a CAM having fields and serially-connected field enable logics, wherein the fields are each coupled to a corresponding one of the serially-connected field enable logics, comprising:
  inputting a current field enable control and previous field enable controls to each of the serially-connected field enable logics;
  generating a global mask and a local mask for each for each of the serially-connected field enable logics, wherein the local mask is generated as a function of the current field enable control, and wherein the global mask is generated as a function of the previous field enable controls and the local mask; and
  providing global match lines from the serially-connected field enable logics based on the current field enable control, the previous field enable controls, the generated global mask, and the generated local mask for each of the serially-connected field enable logics.

9. The method of claim 8 wherein if the current field enable control for a select one of the field enable logics is unselected and the previous field enable controls for the select one of the field enable logics is unselected, then the corresponding field to the select one of the field enable logics is disabled, the global mask is set to evaluate any previous global match lines, and the local mask is set to prevent evaluating local match lines of the corresponding field.

10. The method of claim 8 wherein if the current field enable control for a select one of the field enable logics is selected and the previous field enable controls for the select one of the field enable logics is unselected, then the corresponding field to the select one of the field enable logics is active, the global mask is set to prevent evaluating any previous global match lines, and the local mask is set to evaluate local match lines of the corresponding field.

11. The method of claim 8 wherein if the current field enable control for a select one of the field enable logics is unselected and one or more of the previous field enable controls for the select one of the field enable logics is selected, then the corresponding field to the select one of the field enable logics is disabled, the global mask is set to evaluate any previous global match lines, and the local mask is set to prevent evaluating local match lines of the corresponding field.

12. The method of claim 8 wherein if the current field enable control for a select one of the field enable logics is selected and one or more of the previous field enable controls for the select one of the field enable logics is selected, then the corresponding field to the select one of the field enable logics is active, the global mask is set to evaluate any previous global match lines, and the local mask is set to evaluate local match lines of the corresponding field.

13. The method of claim 8 wherein for the first one of the serially-connected field enable logics the previous field enable controls are set to ground and inputs for the previous global match lines of the first one of the serially-connected field enable logics are set to ground.

14. The method of claim 8 wherein the field enable logics each comprise a mask generation block for generating a global mask and a local mask and a next global match line generation block for generating the next global match lines.

15. The method of claim 14 wherein the next global match line generation block comprises a first OR gate, a second OR gate, and an AND gate, wherein the global mask and previous global match lines are coupled to inputs of the first OR gate, wherein the local match lines and the local mask are coupled to the inputs of the second OR gate, and wherein outputs of the first OR gate and the second OR gate are coupled to the inputs of the AND gate for generating the next global match lines.

16. The method of claim 15 wherein the previous global match lines are provided by a previous one of the field enable logics that is directly before the corresponding one of the field enable logic along the serially-connected field enable logics.

17. The method of claim 15 wherein the previous global match lines for a first one of the serially-connected field enable logics are coupled to a low logic value.

18. The method of claim 14 wherein the mask generation block comprises a first OR gate, a first NOR gate, and an inverter, wherein previous field enable controls are coupled to inputs of the first OR gate, wherein the local mask is generated by the output of the inverter, wherein the corresponding field enable control is coupled to an input of the inverter, and wherein the outputs of the first OR gate and the inverter are coupled to the inputs of the NOR gate to generate the global mask.

19. The method of claim 18 wherein the previous field enable controls for a first one of the serially-connected field enable logics is coupled to ground.

20. A content addressable memory ("CAM") field logic, comprising:
  fields, wherein the fields each have local match lines and wherein the fields each have a corresponding field enable control for enabling the respective field; and
  field enable logics for generating next global match lines, wherein the field enable logics are serially connected,
  wherein each of the fields is coupled to a corresponding one of the field enable logics via the respective local match lines,
  wherein the corresponding field enable control for each of the fields is coupled to the corresponding one of the field enable logic and to any ones of the field enable logics that come after the corresponding one of the field enable logic along the serially-connected field enable logics,
  wherein the field enable logics each comprise a mask generation block for generating a global mask and a local mask and a next global match line generation block for generating the next global match lines,
  wherein the next global match line generation block comprises a first OR gate, a second OR gate, and an AND gate,
  wherein the global mask and previous global match lines are coupled to inputs of the first OR gate, wherein the local match lines and the local mask are coupled to the inputs of the second OR gate, wherein outputs of the first OR gate and the second OR gate are coupled to the inputs of the AND gate for generating the next global match lines, wherein the previous global match lines are provided by a previous one of the field enable logics that is directly before the corresponding one of the field enable logic along the serially-connected field enable logics, wherein the previous global match lines for a first one of the serially-connected field enable logics are coupled to a low logic value, wherein the mask generation block comprises a first OR gate, a first NOR gate, and an inverter, wherein previous field enable controls are coupled to inputs of the first OR gate, wherein the local mask is generated by the output of the inverter, wherein the corresponding field enable control is coupled to an input of the inverter, wherein the outputs of the first OR gate and the inverter are coupled to the inputs of the NOR gate to generate the global mask, and wherein the previous field enable controls for a first one of the serially-connected field enable logics is coupled to ground.

* * * * *